July 1, 1969 D. R. CURRAN ET AL 3,453,458

RESONATOR SUPPORTING STRUCTURE

Filed April 19, 1965

INVENTORS
DANIEL R. CURRAN
JAMES A. SMITH

BY

ATTORNEY

United States Patent Office 3,453,458
Patented July 1, 1969

3,453,458
RESONATOR SUPPORTING STRUCTURE
Daniel R. Curran, Cleveland Heights, and James A. Smith, Lyndhurst, Ohio, assignors to Clevite Corporation, a corporation of Ohio
Filed Apr. 19, 1965, Ser. No. 449,197
Int. Cl. H01v 7/00
U.S. Cl. 310—9.1 4 Claims

ABSTRACT OF THE DISCLOSURE

A wafer type of resonator is provided with an active region in which electromechanical action occurs during operation of the resonator and an inactive peripheral region which is substantially free of electromechanical action during operation of the resonator. The resonator is supported by clamping the inactive region to a surface of one part of a supporting structure by a second part of the structure. Each part of the supporting structure is provided with electrical contact means adapted to engage conductive leads on the resonator.

This invention relates to piezoelectric resonators and, more particularly, to a package for physically supporting wafer type resonators during operation thereof.

The typical wafer type of resonator comprises a wafer of piezoelectric material provided with electrodes on opposite surfaces thereof to enable the resonator to be excited electromechanically in its principal vibratory mode. The wafer may be additionally provided with electrically conductive leads on the opposite face surfaces thereof which extend from the electrodes respectively to the wafer edge to facilitate electrical connection of the resonator in an electrical circuit.

The wafer type of resonator may be provided with a single pair of electrodes or may comprise a multi-resonator structure having several pairs of electrodes defining a plurality of independently operative resonators which can be selectively inter-connected by appropriate leads on the wafer surface in a predetermined filter configuration. Such multi-resonator structures are disclosed and claimed in copending application Ser. No. 216,846, filed on Aug. 14, 1962 by Daniel R. Curran and Adolph Berohn and assinged to the same assignee as the present invention.

During operation it is necessary to support single and multiple resonator structures of the aforementioned type whereby the resonator is free from mechanical restraint. In the past this has been accomplished by delicate structures which "point" support the wafer at a minimum number of spaced points or by utilizing the circuit conductors attached to the resonator leads as a supporting medium. While such supporting techniques serve their intended purpose the resulting structures are fragile and easily damaged by mechanical shock during handling. Additionally the fabrication cost of the resonator is high.

It is a principal object of the present invention to effectively clamp a wafer type of resonator in a supporting package without mechanically affecting vibratory operation thereof.

Another object of the invention is to provide an improved supporting package for a wafer type of resonator.

Another object of the invention is to provide an improved supporting package for a multi-resonator wafer.

Another object of the invention is to provide a hermetically sealed structure in which a resonator is clamped without mechanically affecting vibratory operation thereof.

In one preferred embodiment of the invention a wafer type of resonator is provided with an inactive peripheral edge region surrounding the active region of the wafer. The inactive edge region is clamped to a complemental surface of one part of a supporting structure by a second part of said structure whereby the active region is completely unrestrained during vibration thereof.

Other objects and advantages will become apparent from the following description taken in connection with the accompanying drawings wherein.

Figure 1:
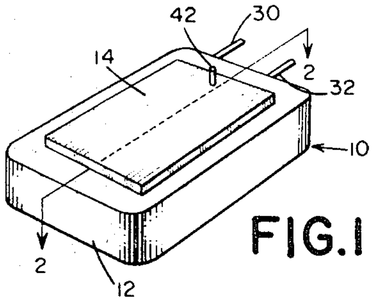
FIGURE 1 is a perspective view of a resonator supporting structure embodying the invention.
Figure 2:
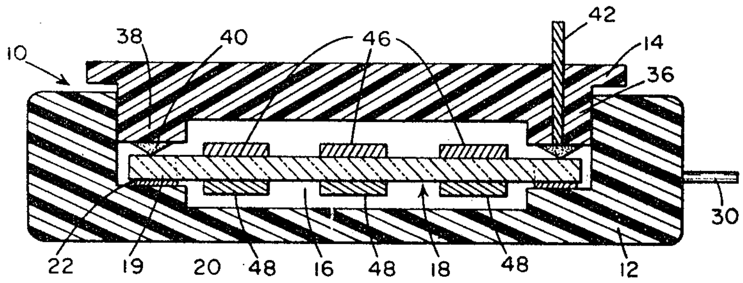
FIGURE 2 is a section taken along the line 2—2 of FIGURE 1.

Referring to FIGURES 1 and 2 of the drawings there is shown a resonator supporting structure or package indicated generally by the reference numeral 10. The package 10 comprises generally a main supporting housing 12 having an upper cover plate 14. The parts 12 and 14 are formed from electrical insulating material and are preferably molded from a plastic material such as nylon whereby the parts may be heat welded together upon assembly as will later be described to define a hermetically sealed structure. Alternately the parts 12 and 14 may be formed from a material such as glass or ceramic and cemented together.

Figure 4:
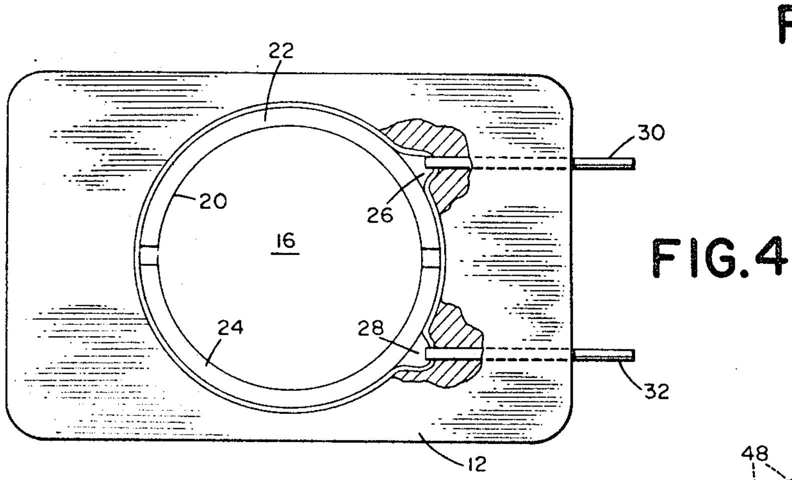
FIGURE 4 is a top view of one part of the structure depicted in FIGURES 1 and 2.

Referring specifically to FIGURES 2 and 4 the supporting housing 12 is of generally rectangular configuration defining a generally cylindrical cavity 16 having a diameter slightly exceeding the diameter of a piezoelectric resonator 18 to be supported therein. The housing 12 is further provided with an annular shoulder 20 defining a surface adjacent the bottom portion thereof on which an inactive peripheral edge region 19 of the resonator 18 is seated as shown in FIGURE 2. To facilitate connection of the resonator 18 in a circuit electrical contact strips 22 and 24 which may comprise segments of copper or silver foil are cemented to the surface of shoulder 20 to be engaged by the resonator leads as will be hereinafter described in more detail. As shown the adjacent ends of contact strips 22 and 24 are spaced to be electrically insulated from each other and are provided with integral tabs 26 and 28 which are adapted to be electrically connected such as by soldering to pins 30 and 32 respectively extending through the end of housing 12.

Figure 3:
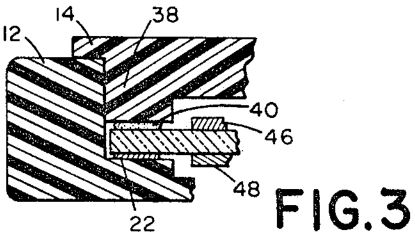
FIGURE 3 is a fragmentary section taken along the line 2—2 illustrating a different position of several parts.

The peripheral edge region 19 of the resonator 18 is adapted to be resiliently clamped to the shoulder 20 by means of cover plate 14. Specifically, plate 14 is of generally rectangular configuration and provided with a depending cylindrical portion 38 adapted to be slidably received within cavity 16 as shown in FIGURE 2. The plate 14 is adapted to engage the upper surface of housing 12 as shown in FIGURE 3 and determine the position of portion 38 relative to the housing 12.

The cover plate 14 further defines an annular flange or shoulder 38 depending from the lower end of depending portion 36 of width and diameter complemental to that of shoulder 20. Resilient contact means comprising for example an annular (in this case continuous) strip 40 of silver or gold plated steel wool is cemented to the surface of flange 38 as shown in FIGURE 2 to engage the peripheral edge region 19 of the resonator 18 and make electrical contact with a lead on the resonator upper surface as will be hereinafter described in more detail. The contact 40 may alternately comprise an annular part formed from a suitable elastomer coated with an electrically conductive material. The contact 40 is electrically connected such as by soldering to a conductive pin 42 extending through the cover plate 14 as shown in FIGURE 2.

Referring to the specific function of cover plate 14, when the depending portion 36 is inserted in cavity 16 as shown in FIGURE 2 the resilient contact 40 will engage the edge region 19 of resonator 18 as shown in FIGURE 2. Preferably the relative dimensions of the parts are such that in the position of plate 14 depicted in FIGURE 2, a slight spacing will exist between cover plate 14 and the upper surface of housing 12. Upon application of pressure, the cover plate 14 is displaced downward causing compression of contact 40 between shoulder 38 and the edge region 19 of resonator 18 and engagement of cover plate 14 with the upper surface of housing 12 as shown in FIGURE 3. This displacement of cover plate 14 causes the resilient contact 40 to resiliently clamp the edge region 19 of resonator 18 to the shoulder 20 of housing 12. With the cover plate 14 thus positioned, the edges thereof may be heat welded to housing 12 to define a hermetically sealed structure.

The clamping pressure exerted by resilient contact 40 is determined by the resiliency of the contact material and the relative dimensions of the associated parts. As will be apparent to those skilled in the art the clamping pressure may be easily varied by changing the resiliency and associated part dimensions.

The structure described thus resiliently clamps the edge region 19 of the resonator 18 between electrical contacts whereby the central active region of the resonator is free from mechanical restraint. By appropriately sizing the edge region 19 as will now be described whereby said portion is an inactive region of the resonator 18 the clamping pressure exerted on the edge portion will not affect the resonator operation.

Figure 6:
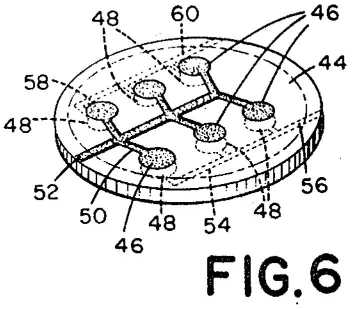
FIGURE 6 is a top view of the resonator structure shown in FIGURE 2.
Figure 5:
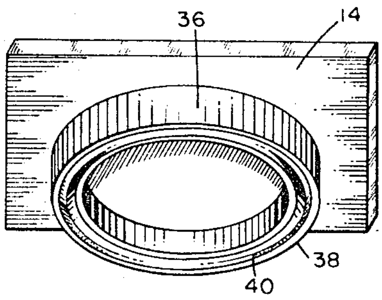
FIGURE 5 is a perspective view of another part of the structure depicted in FIGURES 1 and 2.

Referring now to FIGURES 2 and 6 of the drawings the resonator 18 may comprise a multiple resonator structure of a type disclosed and claimed in copending application Ser. No. 218,846. Specifically the structure shown in FIGURES 2 and 6 comprises a wafer 44 of piezoelectric material having a plurality of spaced electrodes 46 on one major surface thereof and aligned counter electrode 48 on the opposite major surface. The electrodes 46 and 48 coact with intervening piezoelectric material to define a plurality of independently operative piezoelectric resonators. In the particular example shown electrodes 46 are interconnected by a conductive lead pattern 50 having a portion 52 extending to the wafer edge to be engaged by contact 40 when the resonator is mounted as shown in FIGURE 2. Three of the opposite electrodes 48 are connected by a conductive lead pattern 54 having a portion 56 extending to the wafer edge to be contacted by contact 24. Similarly the other three counter electrodes 48 are interconnected by a conductive lead pattern 58 having a portion 60 extending to the wafer edge to be contacted by contact 22. The lead patterns may comprise thin strips of material such as aluminum, gold or silver vapor deposited on the wafer surface or in suitable recesses in the wafer surface to provide perfectly flush face surfaces.

The electrical connections of the electrodes established by the lead patterns 50, 54 and 58 connect the individual resonators in a lattice filter configuration, the lead portions 52, 56 and 60 comprising the circuit terminals. The particular filter configuration depicted is by way of example only. The many variations possible form no part of the present invention and further description is deemed unnecessary.

As disclosed in application Ser. No. 216,846 each pair of electrodes define a piezoelectric resonator having a determinable range of electromechanical action R in wafer thicknesses in the wafer material surrounding the electrodes within which an electromechanical action is excited by the resonator and beyond which no significant electromechanical action is present. In accordance with this concept the individual resonators are spaced from each other and the wafer edge by a distance at least equal to RT where T is the wafer thickness to provide simultaneous independent operation of the individual resonators.

To accomplish structural mounting of the resonator 18 in accordance with the present invention the resonator wafer is preferably sized such that the resonator electrodes 46 and 48 are spaced from the inner boundary of the peripheral edge region 19 by a distance at least equal to RT to render edge region 19 inactive. Accordingly clamping of the edge region 19 as shown in FIGURE 2 does not affect operation of the resonators.

While the invention has been disclosed in connection with a three terminal multi-resonator structure it will be apparent that the mounting concept is equally applicable to single resonators having a single pair of electrodes and leads or multiple resonators having a large number of terminals. The contacts 22, 24 and 40 may be variously positioned and segmented as is necessary to accommodate the leads of a particular resonator structure. Similarly the conductive pins 26, 28 and 42 may be variously located and increased or decreased in number. It will also be apparent that the invention is equally applicable to the mounting of resonators having non-circular configurations by suitably dimensioning and shaping the various parts of the supporting structure disclosed.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

It is claimed and desired to secure by Letters Patent of the United States:

1. In a supporting structure for a wafer type resonator, defining an active central planar region where electromechanical action occurs during operation of the resonator and an inactive peripheral planar region which is substantially free of electromechanical action during operation of the resonator and having conductive leads formed on opposite surfaces of the inactive region, the combination comprising: a housing of insulating material having a cavity therein; a shoulder formed on said housing within said cavity and defining a supporting surface of dimensions generally complemental to the dimensions of the inactive region of the resonator to be engaged by one surface of the inactive region; at least one electrical contact on said supporting surface for making electrical contact with a conductive lead on said one surface of the inactive region; a part of insulating material for enclosing said cavity; and at least one resilient electrical contact on said part adapted to engage the other opposite surface of the inactive region to resiliently clamp the inactive region to said supporting surface and make electrical contact with a conductive lead on said opposite surface of the inactive region.

2. In a supporting structure as claimed in claim 1 wherein electrically conductive pins are connected to said contacts respectively and extend from said housing and part respectively for connection to an external circuit.

3. In a supporting structure as claimed in claim 1 wherein said housing and said part are formed from plastic material and said part is adapted to be heat welded to said housing to define a hermetically sealed structure.

4. In a supporting structure as claimed in claim 1 wherein said housing and said part are formed from ceramic material and said part is cemented to said housing.

References Cited

UNITED STATES PATENTS

| | | | |
|---|---|---|---|
| 2,761,076 | 8/1956 | Hansell | 310—9.1 |
| 2,824,219 | 2/1958 | Fisher | 310—9.1 |
| 2,912,605 | 11/1959 | Tibbetts | 310—9.1 |
| 2,963,597 | 12/1960 | Gerber | 310—9.8 |
| 2,967,957 | 1/1961 | Massa | 310—9.4 |
| 3,073,975 | 1/1963 | Bigler | 310—9.4 |
| 3,137,836 | 6/1964 | Glover | 310—9.4 |
| 3,173,035 | 3/1965 | Fisher | 310—9.1 |
| 3,201,621 | 8/1965 | Milner | 310—9.8 |
| 3,222,622 | 12/1965 | Curran | 310—9.8 |
| 3,359,435 | 12/1967 | Webb | 310—9.1 |
| 3,185,868 | 5/1965 | Coyle | 310—9.1 |
| 3,222,462 | 12/1965 | Karmann | 310—9.1 |
| 3,396,287 | 8/1968 | Horton | 310—9.1 |
| 2,817,778 | 12/1957 | Shepherd | 310—9.7 |

J D MILLER, *Primary Examiner*

U.S. Cl. X.R.

310—8.6, 9.6, 9.8; 333—72